United States Patent [19]

Glass et al.

[11] Patent Number: 4,556,790

[45] Date of Patent: Dec. 3, 1985

[54] PHOTODETECTOR HAVING A CONTOURED, SUBSTANTIALLY PERIODIC SURFACE

[75] Inventors: Alastair M. Glass, Rumson; Paul F. Liao, Fair Haven, both of N.J.

[73] Assignee: AT&T Bell Laboratories, Murray Hill, N.J.

[21] Appl. No.: 445,461

[22] Filed: Nov. 30, 1982

[51] Int. Cl.$^4$ .......................................... H01L 31/00
[52] U.S. Cl. .............................. 250/211 J; 136/256; 357/30
[58] Field of Search ........................ 250/211 R, 211 J; 136/256; 357/30

[56] References Cited

U.S. PATENT DOCUMENTS

| | | | |
|---|---|---|---|
| 4,252,865 | 2/1981 | Gilbert et al. | 136/256 X |
| 4,268,347 | 5/1981 | Stephens | 136/256 X |
| 4,277,793 | 7/1981 | Webb | 357/30 |
| 4,328,390 | 5/1982 | Meakin et al. | 136/256 X |

OTHER PUBLICATIONS

K. Ijichi and S. Okamura, "A Fast Detector by Discontinuous Metal Films for the Millimeter Wave Through Infrared Range," *The Transactions of the IECE of Japan*, E 60 (3) 166, (1977).
S. Okamura and K. Ijichi, "A Fast Detector by Discontinuous Metal Film for the Millimeter Through Optical Frequency Range," *Transactions on Instrumentation and Measurement*, IM-25 (4), 437–440, (1976).
S. L. McCarthy and J. Lambe, "Thin–Film Light Emitting Display Devices," *American Institute of Physics Conf. Proc.* (U.S.A.), 66 157–166, (1980).
S. L. McCarthy and J. Lambe, "Enhancement of Light Emission from Metal–Insulator–Metal Tunnel Junctions," *Applied Physics Letters*, 30 (8), 427–429, (1977).
J. Lambe and S. L. McCarthy, "Light Emission from Inelastic Electron Tunneling," *Physical Review Letters*, 37(14), 923–925, (1976).
S. L. McCarthy and J. Lambe, "Leit Effect in Metal–Insulator–Semiconductor Tunnel Junctions," *Applied Physics Letters*, 33(10), 858–860, (1978).
P. K. Hansma and H. P. Broida, "Light Emission from Gold Particles Excited by Electron Tunneling," *Applied Physics Letters*, 32(9), 545–547, (1978).
R. K. Jain, S. Wagner, and D. H. Olson, "Stable Room–Temperature Light Emission from Metal–Insulator–Metal Junctions," *Applied Physics Letters* 32(1), 62–64, (1978).
N. Kroó, Zs. Szentirmay, and J. Félszerfalvi, "On the Origin of Light Emission by Tunnel Junctions," *Physics Letters*, 81A(7), 399–401, (1981).
J. Kirtley, T. N. Theis, and J. C. Tsang, "Light Emission from Tunnel Junctions on Gratings," *Physical Review B*, 24(10), 5650–5663, (1981).
O. P. Balkashin, M. K. Yanson, and Yu. G. Naidyuk, "Electron Tunneling Stimulated by Surface Plasmons," *JETP Letters*, 27(2), 79–82, (1978).
R. K. Jain, M. G. Farrier, and T. K. Gustafson, "Direct Observation of the Optical Plasma Resonance of Ag by Photon–Assisted Tunneling," *Physical Review Letters*, 36(8), 435–438, (1976).

*Primary Examiner*—Edward P. Westin
*Attorney, Agent, or Firm*—Bernard Tiegerman

[57] ABSTRACT

A photodetector, and a method for detecting electromagnetic radiation, is disclosed. The photodetector includes a body which undergoes a detectable, internal physical or chemical change when exposed to electromagnetic radiation, as well as means for detecting this change. The photodetector also includes a substantially periodic surface which increases the efficiency with which incident electromagnetic radiation is coupled onto the photodetector.

22 Claims, 3 Drawing Figures (SPS = SUBSTANTIALLY PERIODIC SURFACE)
(ECS = ELECTRICALLY CONDUCTIVE STRIP)

(SPS = SUBSTANTIALLY PERIODIC SURFACE)

(SPS = SUBSTANTIALLY PERIODIC SURFACE)
(ECS = ELECTRICALLY CONDUCTIVE STRIP)

(SPS = SUBSTANTIALLY PERIODIC SURFACE)
(ECS = ELECTRICALLY CONDUCTIVE STRIP)

PHOTODETECTOR HAVING A CONTOURED, SUBSTANTIALLY PERIODIC SURFACE

BACKGROUND OF THE INVENTION

1. Field of the Invention

The invention pertains to photodetectors.

2. Art Background

A photodetector (for the purposes of this invention) is a device which undergoes a detectable, internal change in its physical or chemical properties, e.g., an internal change in its mechanical, electrical, electronic, or optical properties, when exposed to electromagnetic radiation, and is a device which includes a means, e.g., electrodes, for detecting this change. Thus, for example, a photovoltaic device is a photodetector because such a device undergoes an internal change in its electrical properties, i.e., a current is induced within the device, when the device is exposed to electromagnetic radiation, and the device typically includes electrodes for detecting the current.

Two criteria which are often used to evaluate the usefulness of a photodetector for a particular purpose are its responsivity and operating speed. The former involves the magnitude of the change induced in response to the incident electromagnetic radiation, and the latter involves the time lag between a variation in the intensity of the incident electromagnetic radiation and the corresponding detected variation in the induced internal change.

The desire in many applications to have high responsivity and high speed imposes conflicting constraints on a photodetector configuration. Generally, to attain high responsivity, a relatively large amount of electromagnetic radiation absorbing material is required to produce a relatively large induced internal change, i.e., a large device structure is desirable. On the other hand, generally to attain high speeds, a small device structure should be employed. A small device decreases internal capacitance and/or internal change propagation distances and thus increases speed.

The conflicting constraints imposed on photodetectors which must exhibit both high responsivities and high operating speeds is exemplified by the conflicting physical constraints imposed on metal-isulator-metal (MIM) photodetectors required to have both high operating speeds and high responsivities. An MIM photodetector typically includes a layer of electrically insulating material, e.g., a metal oxide or a semi-insulator, sandwiched between two electrodes, e.g., two flat, smooth layers of metal. When a metal oxide is employed, the photodetector is denominated an MOM device, e.g., Al-Al$_2$O$_3$-Ag. When a semi-insulator is employed together with one transparent (at least 10 percent of the incident radiation is transmitted) electrode, the photodetector is denominated an MSM device, e.g., Al-amorphous Si-Al. A voltage difference (typically 1 to 2 volts) is applied across the electrodes during the operation of the photodetector.

Electromagnetic radiation incident on an electrode of an MOM device is largely reflected and to a much lesser extent is coupled into the device via the excitation of electrons in one or both of the electrodes. These excited electrons then tunnel across the oxide layer to the other electrode. The time required for these electrons to traverse the oxide layer (typically 50 Angstroms thick) is of the order of $10^{-14}$ seconds and thus, in principle, these MOM devies are capable of operating at very high operating speeds limited typically by device capacitance. However, the quantum efficiencies (the number of electrons produced within the MOM device per photon of incident radiation) of these devices is extremely low, typically about $10^{-4}$, because only a relatively small amount of the incident radiation is actually coupled into the device. Thus these MOM devices are unattractive for many practical applications.

When electromagnetic radiation impinges the transparent electrode of an MSM device, it is believed that a portion of the transmitted radiation is absorbed by the semi-insulating material where electron-hole pairs are produced. The electrons and holes drift through the semi-insulating material, to one or the other of the electrodes, under the influence of a voltage difference (typically 1–2 volts) applied across the electrodes during the operation of the device, to define a detectable current. Like the MOM devices, the MSM devices also exhibit high operating speeds because, for example, if the semi-insulating layer is only about 100 Angstroms thick, then the charge carriers only require a time interval of the order of $10^{-12}$ seconds to drift from one side of the semi-insulating layer to the other side. These MSM devices also exhibit low quantum efficiencies (typically about $10^{-3}$), again because only a relatively small amount of the incident radiation is coupled into the device, i.e., is absorbed by the semi-insulating layer to produce electron-hole pairs. The quantum efficiencies of the MSM devices are readily increased by increasing the thickness of the semi-insulating layer and thus increasing the absorption of transmitted photons. But the increased thickness of the semi-insulating layer increases propagation distance and thus reduces operating speed.

Consequently, those engaged in the development of photodetectors in general, and MIM photodetectors in particular, have long sought, thus far without success, techniques for enhancing the responsivities of photodetectors, which techniques do not require increases in the sizes of photodetectors.

SUMMARY OF THE INVENTION

The invention involves the realization that photodetectors exhibit significantly improved responsivities (the responsivities are typically increased by a factor of about 10), without increases in their physical dimensions, when the surfaces of the photodetectors are formed to have substantially periodic variations in height. The average spacing between the resulting "bumps" on the surfaces of the photodetectors is preferably proportional to the wavelength of the electromagnetic radiation which is to be detected with the photodetectors. It is believed that structuring the surface of a photodetector to have a substantially periodic waveform increases the amount of the incident electromagnetic radiation which is surface coupled into the photodetector, which obviates the need for increasing the size of the photodetector to increase the responsivity of the photodetector.

When an MOM photodetector having a substantially periodic surface is exposed to electromagnetic radiation, the MOM photodetector exhibits two different phenomena which enhance electron tunneling. Such a photodetector is readily modified to enhance one or the other of the two phenomena to produce a photodetector which is either sensitive or insensitive to the incidence angle of the electromagnetic radiation.

DETAILED DESCRIPTION

Figure 1:
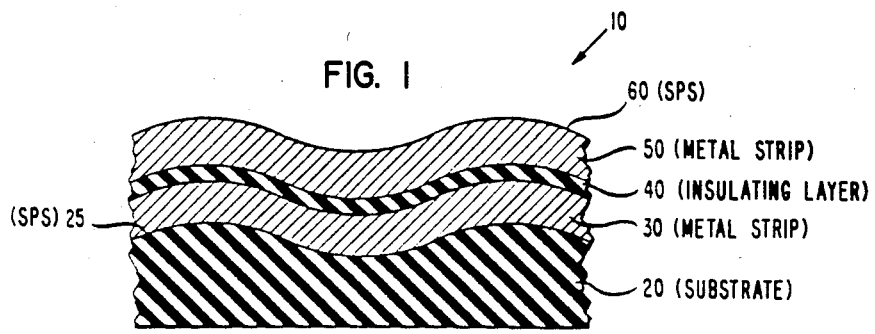
FIGS. 1-3 are cross-sectional views of photodetectors encompassed by the invention.

The invention pertains to photodetectors, as well as to processes for detecting electromagnetic radiation. These processes involve the step of detecting a physical or chemical change induced within a photodetector exposed to electromagnetic radiation.

The photodetectors encompassed by the invention have surfaces which are substantially periodic, i.e., surfaces whose heights vary substantially periodically (relative to a reference surface) as one moves along the surfaces of these photodetectors. These substantially periodic surfaces are, for example, external surfaces, directly impinged by electromagnetic radiation during the operation of the photodetectors. Alternatively, these surfaces are internal to a photodetector and are subjected to electromagnetic radiation which is transmitted through an overlying layer or layers of material.

In practice, the substantially periodic surfaces are formed by structuring, e.g., etching, an initially relatively smooth surface to form a bumpy surface. The resulting bumpy surface then constitutes the substantially periodic surface. Alternatively, a layer of material is deposited onto the bumpy surface, which material conforms to the shape of the bumpy surface, the upper or lower surface of the deposited material being the substantially periodic surface. In either case, an imaginary surface, spatially coincident with the original smooth, unstructured surface constitutes the reference surface alluded to above. This reference surface is either flat or curved but, in order that a structured curved surface be a bumpy surface, the radius (or radii) of curvature of the curved reference surface should be greater than the radius of curvature of the bumps, and preferably greater than ten times the radius of curvature of the bumps.

For purposes of the invention, a bumpy surface is "substantially periodic" if two criteria are met. The first criterion is that at least 75 percent of the "bumps" on a bumpy surface meet the condition that the spacing between the peaks (or the bottoms of the troughs) of any two adjacent "bumps" on the bumpy surface differs from the average spacing, $\Lambda$, by no more than about $0.2\Lambda$. These "bumps", it should be noted, can have any shape, e.g., spherical, cylindrical, or pyramidal.

The second criterion which must be met by a substantially periodic surface pertains to the reflected light pattern produced by such a surface. If parallel light, of wavelength greater than the average bump spacing, $\Lambda$, and of spot size greater than $10\Lambda$, is shined onto a substantially periodic surface, then the reflected light will form what is essentially a diffraction pattern. The angular position, $\theta$ (relative to the incident light), of the center of each bright spot in the diffraction pattern which would be produced by a perfectly periodic surface (having no deviation in the spacing between bumps) is given by $$(\Lambda)(\sin \theta) = n\lambda,$$

where $\lambda$ is the wavelength of the incident light and n is an integer (0,1,2, ... ) which denotes the diffraction order. But the angular position of a bright spot (in the diffraction pattern) produced by a substantially periodic surface can differ slightly i.e. there is a spread of angles, from the angular position of the corresponding bright spot produced by a perfectly periodic surface. This angular difference, is, however, less than or equal to $0.2\theta$.

It has been found that photodetectors which have substantially periodic surfaces, as defined above, exhibit responsivities which are significantly higher (typically 10 times higher) than the responsivities exhibited by similar types of photodetectors (having similar dimensions) which do not have such surfaces (provided the thicknesses of the comparable photodetectors is less than about 1000 Angstroms).

A substantially periodic surface of a photodetector (encompassed by the present invention) efficiently couples incident electromagnetic radiation into the photodetector as a propagating electromagnetic wave which travels through the photodetector adjacent the substantially periodic surface of the photodetector. This surface coupling effect is either absent, or occurs inefficiently, when the surface of the photodetector is smooth or only randomly roughened. Thus, because incident electromagnetic radiation is more efficiently surface coupled into the photodetectors encompassed by the invention, the responsivities of these photodetectors (as compared to photodetectors which do not have substantially periodic surfaces) are increased without any increase in the dimensions, for example, the thicknesses, of these photodetectors.

Not all wavelengths of electromagnetic radiation impinging the substantially periodic surface of a photodetector (encompassed by the invention) are surface coupled into the photodetector. It is determinable from basic principles, i.e., conservation of momentum (see, e.g., H. Raether, *Excitation of Plasmon and Interband Transitions by Electrons*, (Springer-Verlag, 1980), p. 128), that the wavelength, $\lambda$, of electromagnetic radiation which is surface coupled into a photodetector is given by the relation $$\frac{2\pi \sin\theta}{\lambda} \pm \frac{2\pi}{\Lambda} = \frac{2\pi(n_{eff})}{\lambda}. \quad (1)$$

Here, $\theta$ denotes the angle the incident radiation makes relative to a normal to the reference surface (defined above) of the photodetector. (If the reference surface is curved, then the orientation of the normal, and thus the angle $\theta$, will differ from point to point, as will the wavelengths coupled into the surface.)

The parameter $n_{eff}$ in Equation (1) denotes the effective index of refraction of the photodetector. If the photodetector consists of several different materials (for a single material $n_{eff}$ is just the index of refraction of that material) then $n_{eff}$ is determined, for example, by exposing a control sample of the photodetector (having a known bump spacing, $\Lambda$) to known electromagnetic radiation (consisting of many wavelengths) incident at a known angle, $\theta$. The wavelength of electromagnetic radiation surface coupled into the control sample is inferred by detecting the wavelengths of the electromagnetic radiation transmitted by the control sample. From a knowledge of the surface coupled wavelength, $\lambda$, the average bump spacing, $\Lambda$, and the incidence angle, $\theta$, the value of $n_{eff}$ is then readily determined from Equation (1). For most materials, of most composite materials, $n_{eff}$ is greater than 1 but less than about 5.

From Equation 1, above, it follows that $$(\Lambda)(n_{eff}) = \frac{\lambda}{1 - \frac{\sin\theta}{n_{eff}}}. \qquad (2)$$

Both Equations (1) and (2) make it clear that photodetectors encompassed by the invention are both wavelength and angle specific, i.e., the responsivity of a photodetector (characterized by a bump spacing $\Lambda$ and effective index of refraction $n_{eff}$) will only be affected by a particular wavelength, $\lambda$, of electromagnetic radiation incident at a particular angle, $\theta$. Furthermore, from Equation (2), it follows that in order for a photodetector (encompassed by the invention) having an effective index of refraction $n_{eff}$ to detect electromagnetic radiation of wavelength $\lambda$, incident at angle $\theta$, the bump spacing $\Lambda$ is chosen to be proportional to $\lambda$ (the proportionality factor being $(n_{eff} - \sin\theta)^{-1}$).

As noted above, the spacings between the bumps on the surfaces of the photodetectors emcompassed by the invention can vary from the average spacing, $\Lambda$, by as much as about $0.2\Lambda$. Consequently, the electromagnetic radiation surface coupled into a photodetector encompassed by the invention will not necessarily be limited to a particular wavelength, $\lambda$ (defined by Equation (2)). Rather, there will be a band of wavelengths surface coupled into the photodetector, the maximum width of this band (about a mean wavelength, $\lambda$), $\Delta\lambda$, given by $$\Delta\lambda = (n_{eff} - \sin\theta)\Delta\Lambda. \qquad (3)$$

Here, $\Delta\Lambda$ denotes the maximum deviation from the average spacing, $\Lambda$, which maximum deviation is less than or equal to about $0.2\Lambda$.

If a photodetector (encompassed by the invention) is to detect two or more non-overlapping wavelength bands (or one or more wavelengths in each of the non-overlapping bands) or is to detect a wavelength band which is broader than that detectable by a single set of substantially periodic bumps then, in accordance with the invention, the photodetector is fabricated to have two or more sets of substantially periodic bumps. The average bump spacing, $\Lambda$, for each set of bumps is chosen to be proportional to the wavelength, or mean wavelength, to be detected. In addition, the maximum deviation, $\Delta\Lambda$, for each set of bumps should be large enough to couple in the desired wavelength band $\Delta\lambda$.

The amplitude of a bump on a substantially periodic surface is defined as half the distance between the planes tangent, respectively, to the peak of the bump and the bottom of an adjacent trough. In accordance with the invention, the average amplitude of the bumps on the portion of a substantially periodic surface impacted by electromagnetic radiation, ranges from about $0.1\Lambda$ to about $10\Lambda$. Average amplitudes smaller than about $0.1\Lambda$ are undesirable because an undesirably small amount of electromagnetic radiation will be surface coupled into the photodetector. Average amplitudes greater than about $10\Lambda$ are undesirable because they are difficult to fabricate.

One convenient technique for fabricating photodetectors having substantially periodic surfaces, according to the invention, is to deposit the one or more layers of material of the photodetector onto a substrate having a substantially periodic surface. Upon being deposited, the one or more layers of material (provided they are relatively thin) conform to the shape of the underlying substrate surface.

A locally flat surface of a substrate is made substantially periodic by employing, for example, a holographic technique. In accordance with this halographic technique, a patternable masking layer, e.g., a photoresist, is deposited onto the substrate surface. An interference pattern is then defined in the photoresist, in a first direction, by, for example, exposing the photoresist to light from two intersecting laser beams. The first direction referred to here is the direction of the line defined by the intersection of the plane containing the two laser beams and the substrate surface. If the light of each of the laser beams is of wavelength $\lambda_1$, and if each of the laser beams makes an angle $\phi$ with respect to a normal to the substrate surface, then the spacing between the resulting intensity maximums in the photoresist will be $\lambda_1/2 \sin\phi$. By repeating this exposure procedure in a second direction, perpendicular to the first direction, and then developing the photoresist, a two-dimensional, periodic pattern is delineated in the photoresist. If the underlying substrate is then etched, using the patterned photoresist as an etch mask, a two-dimensional, substantially periodic array of bumps (the average spacing between the bumps will be $\lambda_1/2 \sin\phi$) is formed on the surface of the substrate. Of course, this same technique is applicable to the surface of the photodetector itself, to directly transform the photodetector surface into a substantially periodic surface.

While the invention encompasses photodetectors having substantially periodic surfaces, the invention also encompasses a method for detecting electromagnetic radiation. In accordance with the inventive method, electromagnetic radiation is detected by exposing a photodetector having a substantially periodic surface to electromagnetic radiation, and then measuring the resulting change produced within the photodetector. This procedure has the advantage that a relatively large signal will be measured by virtue of the increased photodetector responsivity resulting from the surface coupling effect produced by the substantially periodic surface.

The invention, while encompassing different types of photodetectors, also encompasses, and is particularly significant in relation to, relatively small, high speed photodetectors, such as the MIM photodetectors. As a pedagogic aid to a more complete understanding of the invention, MOM and MSM photodetectors, encompassed by the invention, are described below. Here, the term MOM photodetector is used to denote an MIM photodetector whose photocurrent is produced by electron tunneling.

Generally, each of the MOM and MSM photodetectors encompassed by the invention includes an insulating layer sandwiched between two electrodes, as well as a substantially periodic surface to enhance the efficiency with which electromagnetic radiation is surface coupled into the device. In the case of the MOM photodetectors, the substantially periodic surface is typically the external surface of an electrode directly impinged by electromagnetic radiation during the operation of the device. In the case of the MSM photodetectors, the substantially periodic surface is typically an internal surface of the device, i.e., the surface of the semi-insulating layer directly beneath an optically transparent electrode impinged by electromagnetic radiation.

During the operation of the MOM and MSM photodetectors encompassed by the invention, an electric field is applied across these devices to propel the charge carriers created by the absorbed electromagnetic radiation to one or the other of the electrodes (to produce a detectable electric current in response to the electromagnetic radiation). This electric field is created, for example, by applying an external voltage difference to the electrodes. Alternatively, in the case of the MSM devices, the two electrodes are formed from, respectively, p-type and n-type semiconductor materials to from p-i-n junctions which exhibit internal electric fields, thereby avoiding the need for an external voltage bias. Yet another alternative employed in the case of the MSM photodetectors is to form a p-n junction during the fabrication of the semi-insulating layer, which p-n junction also exhibits an internal electric field.

Figure 2:
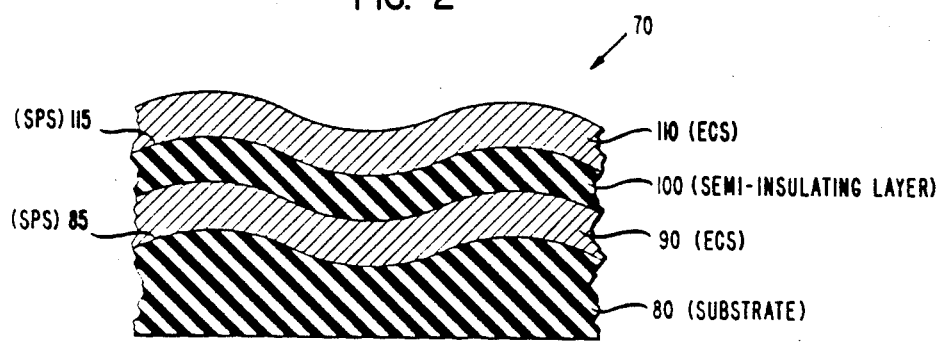
Figure 3:
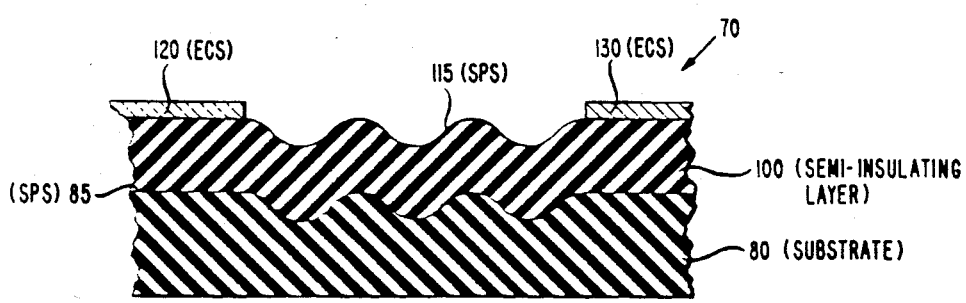

The substantially periodic surfaces of the MOM and MSM photodetectors encompassed by the invention are readily fabricated in a variety of ways such as by directly structuring these (originally relatively smooth) surfaces. However, and merely for the sake of convenience, the substantially periodic surfaces of the photodetectors discussed below, and depicted in FIGS. 1–3, are described as having been fabricated by depositing the layers of material constituting these photodetectors onto a substantially periodic surface of a substrate.

With reference to FIG. 1, an MOM photodetector 10, encompassed by the invention, includes a relatively thin insulating layer 40 sandwiched between first and second metal strips 30 and 50 (the metal strips 30 and 50 constitute the electrodes of the photodetector). The photodetector 10 is fabricated, for example, by depositing, e.g., sputtering, the first metal strip 30 onto the substantially periodic surface 25 of a substrate 20, forming the insulating layer 40 on the surface of the metal strip 30, and then depositing, e.g., evaporating, the metal strip 50 onto the insulating layer 40. In order to reduce the area of the device, and thus reduce device capacitance, the metal strip 50 is typically deposited at an angle, e.g., at a right angle, to the metal strip 30.

The deposition (or formation) of the metal strips 30 and 50 and insulating layer 40 onto the substantially periodic surface 25 of the substrate 20 results in the upper surface 60 of the metal strip 50 acquiring a corresponding, substantially periodic shape. The substantially periodic shape of the surface 60 efficiently couples incident electromagnetic radiation (the wavelength and incidence angle of the coupled radiation is defined by Equation (1) into the metal strip 50 in an energy form contemplated to be a surface plasmon polariton (an electromagnetic wave traveling through an electrically conductive material adjacent the surface of the material). The surface plasmon polariton decays via a single particle excitation mechanism, i.e., electrons in the metal strip 50 are excited to a higher energy state, and these electrons then tunnel across the insulating layer 40 to the metal strip 30.

It has been found that the substantially periodic surface 60 of the metal strip 50 also serves to couple electromagnetic radiation into the metal strip 50 (to enhance electron tunneling) via a second mechanism, as important as the surface plasmon polariton. The second mechanism is believed to be a localized plasma resonance which is produced in each of the "bumps" on the surface 60 by incident electromagnetic radiation of appropriate frequency. This localized plasma resonance constitutes a collective oscillatory motion of the electrons in each bump, transverse to the direction of propagation of the electromagnetic radiation, which transverse motion is bounded by the boundaries of each bump (if there were no such boundaries, there would be no localized plasma resonances). A localized plasma resonance is produced in each bump when the frequency, f, of the incident electromagnetic radiation is equal to $\nu_p/j$, where $\nu_p$ is the bulk plasma frequency of the metal constituting the layer 50 (see, e.g., H. Raether, supra, p. 50, for values of the bulk plasma frequencies of many metals), and j is a geometrical factor defined by the shape of the bumps and the average spacing, $\Lambda$, between the bumps.

In practice, an iterative procedure is used to determine both an appropriate metal for the metal strip 50 and an appropriate average bump spacing, $\Lambda$, which, taken together, will couple specified electromagnetic radiation of wavelength $\lambda$ and frequency f into localized plasma resonances. According to this iterative procedure, a first approximation to the appropriate bump spacing, $\Lambda$, is taken to be $\lambda/2$ and a corresponding first approximation to the geometrical factor j is taken to be j=2. Thus, the metal for the metal layer is chosen so that half the bulk plasma frequency of the metal, i.e., $\nu_p/j(=2)$, is equal to the frequency, f, of the electromagnetic radiation which is to be coupled into localized plasma resonances. But because j=2 is only an approximation to the value of j, the error inherent in this approximation is offset by choosing a new value for the average bump spacing, $\Lambda$, which is appropriate to the choice of the metal (and the shape of the bumps). The new and appropriate bump spacing is determined, for example, by exposing control samples of the photodetector 10, having average bump spacings which differ slightly from the original approximation $\lambda/2$ (the maximum deviation from the original approximation, $\lambda/2$, typically need be no greater than about 50 percent of $\lambda/2$), to electromagnetic radiation of frequency f. The metal strip 50 of each of these control samples is fabricated from the metal chosen above. By detecting the frequency of the electromagnetic radiation which is transmitted by the control samples, the control sample which absorbs the electromagnetic radiation of frequency f, and thus the appropriate bump spacing, is determined.

It should be noted that localized plasma resonances do not occur in MOM photodetectors having smooth surfaces. While localized plasma resonances do occur in island films consisting of electrically isolated particles (formed by depositing thin layers of metal such as Ag, Au), the resonances are quickly reduced, and ineffective to produce significant tunnelling when the particles are brought into contact with one another (to make the films electrically continuous).

The localized plasma resonances produced in the bumps on the substantially periodic surface 60 are relatively insensitive to the angle at which the incident radiation impinges the surface 60, and largely dependent only on the frequency of the incident radiation. In addition, it has been found that the tunneling current produced by the localized plasma resonances increases as the amplitude of the bumps is increased. In fact, the tunneling current produced by the localized plasma resonances is much greater (by a factor of about 2) than the tunneling current produced by the surface plasmon polariton once the amplitude of the bumps is equal to or greater than about $0.5\Lambda$. Consequently, once the bump amplitude is equal to or greater than about $0.5\Lambda$, the MOM photodetector 10 is essentially insensitive to the incidence angle of the electromagnetic radiation.

The materials useful in the inventive MOM photodetector 10 (see FIG. 1) are dependent on whether the photodetector 10 is to be used as a detector which is sensitive or insensitive to the incidence angle of the electromagnetic radiation. In both cases, however, the material of the substrate 20 of the MOM photodetector 10 should preferably be relatively electrically insulating (having a resistivity of at least $10^4$ ohm-cm) in order to confine electrical currents to the interior of the MOM photodetector 10. A useful substrate material is, for example, fused silica.

Almost any metal is useful for the first metal layer 30 of the MOM photodetector 10 (see FIG. 1). However, in one configuration, and in order to more readily control the thickness of the insulating layer 40, the metal is preferably chosen so that it is readily oxidized, e.g., plasma oxidized or anodized, to form the thin insulating layer 40. Included among the metals which are readily plasma oxidized to form metallic oxides are, for example, Al, Mg, and Ni. The metal layer 30 should have a thickness of at least 100 Angstroms to ensure that the layer 30 is physically (and thus electrically) continuous. While there is not theoretical upper limit on the thickness of the metal layer 30, practical considerations, such as the need to minimize fabrication difficulties, usually results in the metal layer 30 being limited to a thickness of no more than about several thousand Angstroms.

The metal layer 50 also consists of almost any metal, e.g., Au, Ag, Al. The thickness of the metal layer 50 ranges from about 100 Angstroms to about 300 Angstroms. Thicknesses less than about 100 Angstroms are undesirable for the reason given above. Thicknesses greater than about 300 Angstroms are undesirable because the magnitude of the tunneling currents is undesirably small.

The layer 40 is a relatively thin layer of material having a high dielectric breakdown strength (typically greater than about $10^4$ volts/cm). Included among the materials which have so high a dielectric breakdown strength and which are used in the layer 40 are metallic oxides such as $Al_2O_3$, $MgO$, and $NiO$. The thickness of the layer 40 ranges from about 10 Angstroms to about 100 Angstroms. A thickness less than about 10 Angstroms is undesirable because so thin a layer is likely to suffer electrical breakdown (even if the material is not physically discontinuous, it will become so upon the application of a voltage difference). On the other hand, thicknesses greater than about 100 Angstroms are undesirable because undesirably small tunneling currents will flow across the layer 40. Because of the ease with which thickness is controlled, the layer 40 is preferably formed by oxidizing, e.g., plasma oxidizing, the metal layer 30. Thus, the insulating layer 40 is preferably an oxide of the metal layer 30, hence the name metal-oxide-metal photodetector.

If the photodetector 10 is to be used as an angle sensitive detector, then not only must the surface 60 of the metal layer 50 be substantially periodic (in order to couple incident electromagnetic radiation into a surface plasmon polariton in the metal layer 50), but the absorption coefficient for the surface plasmon polariton of the metal of the metal layer 50 should preferably be less than $1/\Lambda$. Such an absorption coefficient will permit the surface plasmon polariton to propagate a distance through the metal exceeding the average bump spacing (this is desirable because otherwise the presence of the bumps is almost irrelevant and, for a particular wavelength of incident electromagnetic radiation, the quantum efficiency of the photodetector is not significantly increased). Included among the metals which exhibit such an absorption coefficient are Ag, Au, and Al. For other such metals see, for example, an article by P. B. Johnson and R. W. Christy, *Physical Review*, Vol. B6, 1962, p. 4370.

In order that the MOM photodetector be angle sensitive, the amplitude of the bumps should range from about $0.1\Lambda$ to about $0.3\Lambda$. Amplitudes smaller than about $0.1\Lambda$ are undesirable because the resulting tunneling current is undesirably small. Amplitudes greater than about $0.3\Lambda$ are undesirable because the influence of localized plasma resonances becomes undesirably large and the detector becomes undesirably insensitive to the incidence angle of the electromagnetic radiation.

If the MOM photodetector 10 is to be angle insensitive, then not only are the metal layer 50 and the average bump spacing chosen to produce localized plasma resonances, but the amplitude of the bumps on the surface 60 should range from about $0.5\Lambda$ to about $10\Lambda$. Amplitudes smaller than about $0.5\Lambda$ are undesirable because the influence of surface plasmon polaritons becomes undesirably large and the detector becomes undesirably sensitive to the incidence angle of the electromagnetic radiation. Amplitudes larger than about $10\Lambda$ are undesirable because surfaces having bumps of such amplitudes are undesirably difficult to fabricate.

For example, if visible light, of wavelength equal to about 0.5 $\mu$m (and frequency equal to about $6 \times 10^{14}$ Hz) is to be detected by the MOM photodetector 10, and the detector is to be angle insensitive, then a useful first approximation to the average bump spacing, $\Lambda$, is $\lambda/2 = 0.25$ $\mu$m, and a useful metal for the layer 50 is, for example, Ag, whose bulk plasma frequency is about $10^{15}$ Hz (when divided by 2, this is close to $6 \times 10^{14}$ Hz). By using control samples, it was found that the desired frequency is absorbed by the metal layer 50 if the average bump spacing, $\Lambda$, is equal to 0.25 $\mu$m. Moreover, if the amplitude of the bumps is greater than about $0.5\Lambda = 0.125$ $\mu$m, then the detector 10 is relatively angle insensitive.

With reference to FIG. 2, one embodiment of the MSM photodetector 70 encompassed by the invention includes a layer of semi-insulating material 100 (a material which has a resistivity of at least 1 kilohm-cm) sandwiched between two electrodes, i.e., two strips of electrically conductive material 90 and 110 (of resistivity equal to at most 0.1 ohm-cm). The MSM photodetector 70 is fabricated, for example, by successively depositing the layers 90, 100, and 110 onto the substantially periodic surface 85 of an electrically insulating substrate 80 (having a resistivity preferably greater than about $10^4$ ohm-cm). To reduce device capacitance, the strip 110 is deposited at an angle, e.g., a right angle, to the strip 90.

The major distinction between the MSM photodetector 70 and the MOM photodetector 10 is the fact that the electrical currents produced within the detector 70, in response to incident electromagnetic radiation, are generally due to the absorption of electromagnetic radiation by, and the resulting formation of electron-hole pairs in, the semi-insulating layer 100. In order to permit the formation of large numbers of electron-hole pairs, the electrically conductive layer 110 is fabricated to be significantly transparent to incident electromagnetic radiation (at least 10 percent of the electromagnetic radiation incident on the layer 110 is transmitted by the layer 110), However, if the top layer 110 is, for example, of metal, then the electrical currents produced in the MSM photodetector 70 may be due, at least in part, to excited electrons from the metal layer 110 traversing the semi-insulating layer 100. These excited electrons are formed, for example, by the decay of a surface plasmon polariton in the metal layer 110, which surface plasmon polariton is produced by the surface coupling of electromagnetic radiation into the metal layer 110. Alternatively, these excited electrons result from localized plasma resonances in the bumps on the surface of the metal layer 110.

The deposition of the layers 90, 100, and 110 onto the substantially periodic surface 85 of the substrate 80 results in the surface 115 of the semi-insulating layer 100 acquiring a corresponding, substantially periodic shape. The average spacing, $\Lambda$, between the bumps on the surface 115, in relation to the wavelength, $\lambda$, of the electromagnetic radiation which is to be coupled into the semi-insulating layer 100 (as a propagating electromagnetic wave traveling adjacent the surface 115), is defined by Equations (1) and (2). The average amplitude of the bumps, as before, ranges from about $0.1\Lambda$ to about $10\Lambda$.

The semi-insulating layer 100 is fabricated from any one of a variety of semi-insulating materials. However, all of these semi-insulating materials are materials which exhibit a resistivity of at least 1 kilohm-cm in order to preclude, or at least minimize, dark currents (electrical currents produced within the photodetector 70 in the absence of electromagnetic radiation). Included among the useful semi-insulating materials is (undoped) amorphous silicon which has or has not been hydrogenated (up t 30 atomic percent H). The amorphous silicon is deposited (onto the electrically conductive layer 90) by, for example, conventional sputtering or chemical vapor deposition (CVD) techniques. Other useful semi-insulating materials are (undoped) single crystal silicon and polysilicon. The single crystal silicon is deposited by, for example, CVD or molecular beam epitaxy (MBE) techniques while the polysilicon is deposited using, for example, conventional sputtering or CVD techniques. Still other useful materials are appropriately doped (so as to produce a resistivity of at least 1 kilohm-cm) III-V compounds such as gallium arsenide, indium phosphide, indium gallium arsenide, and indium gallium arsenide phosphide, and II-IV compounds such as mercury cadmium telluride. Depending on the particular material, these materials are deposited by well known MBE, CVD, or liquid phase epitaxy techniques.

The thickness of the semi-insulating layer 100 ranges from about 100 Angstroms to about 1 $\mu$m. Thicknesses less than about 100 Angstroms are undesirable because it is likely that deposited layers of material having such low thicknesses will be physically discontinuous. Thicknesses greater than about 1 $\mu$m, while not precluded, result in the semi-insulating layer 100 being so thick (and thus absorbing so much of the electromagnetic radiation) that little benefit is gained from the substantially periodic surface 115.

While the deposited, electrically conductive layers 90 and 110 both function as electrodes for detecting the photocurrent in the photodetector 70, the layer 110 should also be significantly transparent to electromagnetic radiation (although the layer 90 is also useful if it too is transparent). If the layer 110 consists of a metal, e.g., Au, Ag, or Al, then the thickness of the layer 110 ranges from about 100 Angstroms to about 300 Angstroms. Thicknesses less than about 100 Angstroms are undesirable because such a deposited, e.g., sputtered, layer of metal is likely to be physically (and thus electrically) discontinuous. On the other hand, thicknesses greater than about 300 Angstroms are undesirable because a layer of metal having so great a thickness will not be significantly transparent to electromagnetic radiation (will transmit less than about 10 percent of the incident electromagnetic radiation).

Another material which is useful for fabricating the layer 110 and which is both electrically conductive and substantially transparent to electromagnetic radiation, is indium tin oxide. The indium tin oxide is deposited onto the semi-insulating layer 100 by, for example, sputtering. The thickness of the indium tin oxide ranges from about 300 Angstroms to about 2 $\mu$m. Thicknesses smaller than about 300 Angstroms result in indium tin oxide layers which have undesirably small conductances. Thicknesses greater than about 2 $\mu$m, while not precluded, require an undesirably long time to deposit.

Yet other materials useful for fabricating the layer 110 are appropriately doped semiconductor materials whose band gaps are larger than the band gap of the semi-insulating layer 100. For example, if the semi-insulating layer 100 is a layer of gallium arsenide doped with, for example, chromium to a level of about $10^{18}$ $cm^{-3}$, then the layer 110 is, for example, gallium aluminum arsenide doped with, for example, silicon to a level of about $10^{19}$ $cm^{-3}$. The semiconductor materials for the layer 110 are deposited onto the semi-insulating layer 100 by, for example, conventional low pressure chemical vapor deposition techniques. The thicknesses of these semiconductor materials ranges from about 300 Angstroms to about 2 $\mu$m. Thicknesses outside this range are undesirable for the reasons given above (although thicknesses greater than about 2 $\mu$m are not precluded).

The layer 90 need not be substantially transparent to electromagnetic radiation (although this is not precluded) and thus the layer 90 consists of any of the materials discussed above (in relation to the layer 110), having the thickness ranges discussed above. However, the upper limits of the thickness ranges imposed by the transmissivity requirement do not apply.

In a second embodiment of the MSM photodetector 70, generally similar to the first embodiment, described above, the semi-insulating material of the layer 100 is doped to produce a p-n junction characterized by an internal electrical field of strength equal to at least $10^3$ volts/cm. Such a p-n junction is formed, for example, by depositing half the thickness of the layer 100 and doping this half to produce material of n-type conductivity, and then depositing the remaining half thickness of the layer 100 and doping this remaining half to produce material of p-type conductivity. The existence of the internal electrical bias associated with the p-n junction avoids and need for applying an external voltage bias to the electrically conductive layers 90 and 110 during the operation of the photodetector 70.

In a third embodiment of the MSM photodetector 70, which also avoids the need for the application of an external voltage bias, the electrode 110 (see FIG. 2) includes a layer of semiconductor material of, for example, p-type conductivity (in contact with the layer 100), while the electrode 90 includes a layer of semiconductor material of, for example, n-type conductivity (in contact with the layer 100). Thus, the two electrodes 90 and 110, and the semi-insulating layer 100, define a p-i-n junction. While a variety of semiconductor materials are useful for the electrodes 90 and 110, the resulting p-i-n junction should exhibit an internal electric field which extends across the thickness of the semi-insulating layer 100 and which has a strength of at least $10^3$ volts/cm. Electric field strengths smaller than about $10^3$ volts/cm are undesirable because the time taken by the charge carriers to traverse the thickness of the semi-insulating layer becomes undesirably long.

Of course, the photocurrent produced within the photodetector 70 is detected at the electrodes 90 and 110, and thus each electrode includes a layer of metal which forms a low resistance contact (the resistance should be less than about 100 ohms) with the respective semiconductor layer. For example, if the electrode 110 includes a layer of indium phosphide doped with zinc (p-type conductivity), then a layer of, for example, zinc-gold alloy will form a low resistance contact with the indium phosphide. If the electrode 90 includes, for example, a layer of indium phosphide doped with silicon (n-type conductivity), then a layer of, for example, gold-tin-nickel alloy will form a low resistance contact with the indium phosphide. In order that the electrode 110 be significantly transparent to electromagnetic radiation, the thickness of the metal layer used to form the low resistance contact should be less than about 300 Angstroms, while the thickness of the semiconductor layer should be less than about 1 $\mu$m.

With reference to FIG. 3, a fourth embodiment of the MSM photodetector 70, generally similar to the first embodiment, includes a layer of semi-insulating material 100 (which material has a resistivity of at least 1 kilohm-cm) deposited directly onto the substantially periodic surface 85 of an electrically insulating substrate 80 (the resistance of the substrate material is greater than that of the semi-insulating material). This fourth embodiment of the photodetector also includes two spaced apart, electrically conductive layers 120 and 130 deposited onto the substantially periodic surface 115 of the semi-insulating layer 100, which layers 120 and 130 constitute the electrodes of the photodetector 70.

In operation, when electromagnetic radiation impinges the substantially periodic surface 115, the surface 115 couples the incident radiation into the semi-insulating layer 100 in the form of a propagating electromagnetic wave traveling adjacent the surface 115. The passage of this wave results in the formation of electron-hole pairs near the surface 115, the electrons and holes moving toward one or the other of the electrodes 120 or 130 under the influence of the applied voltage difference.

The semi-insulating layer 100 is deposited onto the substrate 80 by, for example, conventional CVD techniques and is comprised of any of the semi-insulating materials discussed with reference to the semi-insulating layer of the first embodiment of the photodetector 70. The thickness of the semi-insulating layer 100 is as large as is desired, although the thickness should be at least 100 Angstroms in order to ensure the physical continuity of the layer 100.

In the fourth embodiment of the photodetector 70 (see FIG. 3), described above, the coupling of electromagnetic radiation into the semi-insulator layer 100 is preferably confined to the space between the electrodes 120 and 130. Thus, the electrodes are preferably fabricated from electrically conductive materials (of conductivity equal to at least $10^{-3}$ (ohm-cm)$^{-1}$) which are substantially opaque to electromagnetic radiation (no more than about 10 percent of the incident radiation is transmitted through the electrodes). For example, if the electrodes 120 and 130 are of a metal such as Au or Ag, then the thickness of the electrodes should be at least 200 Angstroms in order that they be substantially opaque. Such metal electrodes are, for example, sputtered onto the surface 115 of the semi-insulating layer 100 using a patterned masking layer, e.g., a patterned resist, to prevent the metallization of the portion of the surface 115 which is to absorb electromagnetic radiation.

In yet another embodiment of the MSM photodetector 70 (see FIG. 3), the electrodes 120 and 130 and the semi-insulating layer 100 form a p-i-n junction. Except for the different positions of the electrodes, this p-i-n junction is identical to the one described above. If the electrodes 120 and 130 are to be substantially opaque to incident electromagnetic radiation, then the metal layers used to form the low resistance contacts are made at least 200 Angstroms thick.

EXAMPLE 1

An Al-Al$_2$O$_3$-Ag MOM photodetector, similar in structure to the MOM photodetector shown in FIG. 1, was fabricated by first cleaning a square, fused silica plate (1 inch on a side and 1 mm thick), with conventional solvents. The fused silica plate served as the substrate on which the MOM photodetector was fabricated.

The relatively smooth upper surface of the fused silica plate was lithographically structured (to form a substantially periodic surface) by first evaporating a germanium film, about 800 Angstroms thick, onto the plate. The germanium film was deposited immediately after the cleaning procedure to prevent dust from settling onto the surface of the plate. The purpose of the germanium film was to reduce light reflections from the surface of the fused silica plate during subsequent photolithographic processing. A layer of positive photoresist, about 800 Angstroms thick, was then spun onto the germanium film. This photoresist is sold under the trade name AZ 1450B by the Shipley Company of Newton, Mass.

The photoresist was exposed to two intersecting beams of laser light, each of wavelength equal to 3638 Angstroms and intensity equal to about 10 $\mu$watts/cm$^2$, for about 30 seconds. The two light beams were oriented to intersect at an angle of about 94 degrees in a plane perpendicular to the photoresist surface. The fused silica plate was then rotated 90 degrees (in its own plane) and the photoresist was again exposed to the two light beams for about 30 seconds. A commercially available developer sold under the trade name AZ 351 developer by the Shipley Company was then diluted with water (five parts of water to one part developer) and applied to the photoresist.

The germanium film was then reactive ion etched, using the patterned photoresist as an etch mask, in a CBrF$_3$ plasma. This etching took place while CBrF$_3$ was flowed into the reactive ion etching chamber at about 10 standard cubic centimeters per minute, while the pressure in the chamber was maintained at about 10 microns, and the power density was about 0.05 watts/cm$^2$. Under these conditions, the germanium film required about 10 minutes to etch through its thickness.

The pattern delineated in the photoresist and in the germanium film was then transferred into the fused silica by reactive ion etching the fused silica (using the patterned photoresist and germanium film as an etch mask) in a CHF$_3$ plasma for about 25 minutes. The etching conditions were the same as those specified above except that the power density was about 0.5 watts/cm$^2$. The photoresist and germanium films were then stripped with conventional solvents. From scanning electron micrographs of previous samples which had undergone the same processing, it was known that the surface of the fused silica plate now consisted of a substantially periodic, two-dimensional array of bumps with the average spacing between the bumps being about 2500 Angstroms and the average amplitude (half the distance from the peak to the trough) of the bumps being about 1250 Angstroms.

Conventional evaporation techniques were then used to evaporate an aluminum stripe onto the substantially periodic surface of the fused silica plate. The width of this stripe was about 1 mm while the thickness was about 440 Angstroms. A layer of Al$_3$O$_3$ was then formed on the surface of the aluminum stripe by plasma oxidizing the aluminum stripe in an oxygen atmosphere at a pressure of about 30 microns and for about 10 minutes. The thickness of the Al$_2$O$_3$ layer, as inferred from later capacitance measurements on the MOM photodetector, was about 50 Angstroms. A stripe of silver, about 1 mm wide and about 180 Angstroms thick, was then evaporated onto the oxide layer at a right angle to the aluminum layer. Thus, the MOM photodetector, defined by the intersection of the silver stripe with the aluminum stripe and aluminum oxide layer, was about 1 mm on a side. Furthermore, the surface of the silver electrode was substantially periodic (had conformed to the shape of the surface of the fused silica plate).

Two additional MOM photodetectors were also fabricated using the same general procedure described above. One of these MOM photodetectors was fabricated on a substantially periodic surface (of a fused silica plate) whose bumps had an average amplitude of only about 250 Angstroms (the 250 Angstrom bump amplitude was achieved by reactive ion etching the fused silica in the CHF$_3$ plasma for only about 5 minutes). The other MOM photodetector was fabricated, as described above, but on a smooth fused silica surface.

Laser light (p-polarized in the plane perpendicular to the reference surface of the photodetector, i.e., the original unstructured surface of the fused silica plate) of wavelength equal to 476.9 nm was then shined onto the MOM photodetector (onto the silver electrode) whose substantially periodic surface had bumps of average amplitude equal to 250 Angstroms. The photodetector was rotated during its exposure to the laser light so that the light swept out a plane oriented perpendicularly to the reference surface of the detector. During this procedure the light reflected from the MOM photodetector was monitored with a power meter and the intensity of the reflected light was recorded as a function of the incidence angle of the light (the angle relative to a normal to the reference surface of the photodetector, which normal was in the plane swept out by the light). A sharp drop in the reflected light intensity (and thus a sharp increase in the amount of light coupled into the photodetector) was noted at an incidence angle of 54 degrees, which is consistent with the formation of a surface plasmon polariton in the silver electrode of the photodetector, i.e., consistent with Equation (1).

Both of the other two MOM photodetectors were also exposed to the laser light while being rotated, as described above. The measured, reflected light intensities were found to vary slowly with incidence angle (there was no sharp drop at 54 degrees) from which it was concluded that little or no light was being coupled into surface plasmon polaritons.

The optical transmission properties of the MOM photodetector whose substantially periodic surface had bumps of average amplitude equal to 1250 Angstroms (the average bump spacing on the silver surface was about 2500 Angstroms) were then measured with the aid of a commercially available spectrometer (Model No. 14) purchased from the Cary Instruments Corporation of Monrovia, Calif. This spectrometer included a tunable light source, from which light was shined at normal incidence onto the photodetector (onto the silver electrode), and a detector which measured the intensity of the light transmitted through the photodetector as a function of the wavelength of the incident light. The intensity of the transmitted light was measured for wavelengths ranging from about 0.3 $\mu$m to about 0.9 $\mu$m. The transmitted intensity was found to have a broad and substantial dip around 0.5 $\mu$m, from which it was inferred that a band of wavelengths of light, centered about 0.5 $\mu$m, had been coupled into the photodetector through the formation of localized plasma resonances in the silver electrode (the wavelength and incidence angle were inconsistent with the formation of a surface plasmon polariton). The transmitted intensities of the other two detectors, on the other hand, had no such dip.

The magnitudes of the electron tunneling currents produced in each of the three detectors, in response to incident laser light, were then measured while the silver electrode of each detector was biased +1.5 volts relative to the aluminum electrode. The incident laser light, of wavelength equal to 476.9 nm, and intensity equal to about 0.2 watts/cm$^2$, was incident on the silver electrode of each photodetector at an angle of 54 degrees (as defined above). The light was chopped at 150 Hz and was p-polarized (as described above). The photocurrents produced in each photodetector were measured with a conventional lock-in amplifier. A photocurrent of 0.12 microamperes was measured in the MOM photodetector which did not have a substantially periodic surface. This corresponds to a quantum efficiency (q.e.) of about $6 \times 10^{-5}$. However, a photocurrent of 0.8 microamperes, and thus a q.e. of $4 \times 10^{-4}$, was measured in the MOM photodetector whose substantially periodic surface had an average bump amplitude of 250 Angstroms. The increased current and increased q.e. was attributed to the formation of a surface plasmon polariton in the silver electrode of the photodetector. Moreover, a photocurrent of 2 microamperes, and thus a q.e. of aobut $10^{-3}$, was measured in the MOM photodetector whose substantially periodic surface had an average bump amplitude of 1250 Angstroms. The magnitude of this last current was largely attributed to the formation of a localized plasma resonance in the bumps on the silver electrode of the photodetector.

EXAMPLE 2

An MSM photodetector, similar to the MSM photodetector shown in FIG. 2, was fabricated by cleaning and structuring the surface of a fused silica plate, as described in Example 1. The resulting, substantially periodic surface of the fused silica plate had bumps whose average amplitude was about 1250 Angstroms. The average bump spacing was about 2500 Angstroms.

Conventional evaporation techniques were then used to deposit an aluminum stripe onto the substantially periodic surface of the fused silica plate. The width of the stripe was about 1 mm, while the thickness of the stripe was about 300 Angstroms. A layer of hydrogenated, amorphous silicon, about 300 Angstroms thick, was then deposited onto the central region of the aluminum stripe. The silicon was deposited by sputtering, at 200 degrees C., from a silicon target in an atmosphere containing 75 percent (by volume) Ar and 25 percent $H_2$, at a pressure of $10^{-3}$ mm Hg. The r f power density was about 2 watts/cm$^2$ and the sputtering was continued for about 2 minutes. Conventional shadow masking techniques were used to prevent the deposition of the amorphous silicon onto the ends of the aluminum stripe so that electrical contact could later be made to the ends of the aluminum stripe. A stripe of silver, about 1 mm wide and about 150 Angstroms thick, was then evaporated onto the amorphous silicon at a right angle to the aluminum stripe.

A second MSM photodetector was also fabricated, using the procedure described above, except that the surface of the fused silica plate was relatively smooth.

Using the spectrometer described in Example 1, it was determined that light of wavelength equal to about 7000 Angstroms, incident (on the silver electrode) at normal incidence (to the reference surface of the photodetector), was efficiently surface coupled into the MSM photodetector which had the substantially periodic surface (consistent with Equation (1)). With 4 microwatts of light, of wavelength equal to 7000 Angstroms, incident (at normal incidence) on this MSM photodetector, with the light chopped at 150 Hz, and with the silver electrode biased +1.5 volts relative to the aluminum electrode, a photocurrent of $6 \times 10^{-8}$ amperes was measured in the MSM photodetector with the lock-in amplifier. This corresponds to a q.e. of about 1.5 percent. By comparison, and under the same conditions, the photocurrent produced in the MSM photodetector which did not have a substantially periodic surface was only $4 \times 10^{-9}$ amperes, which corresponds to a q.e. of only 0.1 percent.

EXAMPLE 3

An MSM photodetector, of the type shown in FIG. 3, was fabricated by cleaning and structuring the surface of a fused silica plate, as described in Example 1. The resulting, substantially periodic surface of the fused silica plate had bumps whose average amplitude was about 1250 Angstroms. The average bump spacing was about 2500 Angstroms.

A layer of hydrogenated, amorphous silicon, about 300 Angstroms thick, was then deposited onto the substantially periodic surface of the fused silica plate using the procedure described in Example 2. An aluminum stripe, with a 25 μm gap in its center, was then deposited onto the surface of the amorphous silicon, using conventional evaporation and masking techniques. The thickness of the aluminum stripe was 500 Angstroms, and the width of the stripe was 0.5 mm. The two halves of the aluminum stripe constituted the two electrodes of the MSM photodetector.

One half of the aluminum stripe was then connected sampling oscillscope, the output of which was connected to a Nicolet multichannel analyzer. The other half of the aluminum stripe was connected to a 100 volt dc bias. Laser pulses, of 10 picosecond duration, were then focused onto the gap between the aluminum electrodes. The wavelength of the laser pulses was 575 nm. The number of counts generated by the Nicolet analyzer, during a preselected number of signal sweeps, was proportional to the magnitude of the current pulses produced in the MSM photodetector in response to the light pulses. The number of signal sweeps was chosen to be 1024.

Using 40 milliwatts of laser power, with the light incident at normal incidence to the reference surface, the peak output from the MSM photodetector was 9300 counts. At an incidence angle of 45 degrees, the light was efficiently surface coupled onto the amorphous silicon (in accordance with Equation (1)), and the peak output was 70,000 counts. By comparison, the peak output from a similar MSM photodetector, fabricated (as described above) on a smooth fused silica surface, under the same conditions, was only 3000 counts.

What is claimed is:

1. A photodetector, comprising:
   a body which undergoes a detectable change when exposed to electromagnetic radiation, and which includes means for detecting said change when the body is exposed to electromagnetic radiation, CHARACTERIZED IN THAT
   said body also includes a contoured surface which is substantially periodic and includes prominences, the average spacing, $\Lambda$, between, and the composition of, said prominences being chosen to couple at least a portion of said radiation into said body in the form of a propagating electromagnetic wave traveling through said body adjacent said contoured surface and/or localized plasma resonances within said prominences.

2. The photodetector of claim 1 wherein the average spacing, $\Lambda$, between the prominences of said contoured surface is proportional to the wavelength of the electromagnetic radiation to be detected by said photodetector.

3. The photodetector of claim 1 wherein the amplitude of said prominences ranges from about $0.1\Lambda$ to about $10\Lambda$.

4. The photodetector of claim 1 wherein said body includes a layer of electrically insulating material sandwiched between first and second layers of metal, and wherein said second layer of metal includes said contoured surface which is exposed to electromagnetic radiation during the operation of said photodetector.

5. The photodetector of claim 4 wherein said electrically insulating layer has a dielectric breakdown strength greater than about $10^4$ volts/cm.

6. The photodetector of claim 5 wherein said electrically insulating layer is a metallic oxide.

7. The photodetector of claim 5 wherein the thickness of said insulating layer ranges from about 10 Angstroms to about 100 Angstroms.

8. The photodetector of claim 7 wherein the thickness of said second metal layer ranges from about 100 Angstroms to about 300 Angstroms.

9. The photodetector of claim 4 wherein the average spacing, $\Lambda$, between the prominences of said contoured surface is proportional to the wavelength of the electromagnetic radiation to be detected by said photodetector.

10. The photodetector of claim 9 wherein the average amplitude of said prominences ranges from about $0.1\Lambda$ to about $0.3\Lambda$.

11. The photodetector of claim 4 wherein the metal of said second metal layer, and the average spacing, $\Lambda$, between the prominences of said contoured surface, are chosen to produce localized plasma resonances within said prominences.

12. The photodetector of claim 11 wherein the amplitude of said prominences ranges from about 0.5Λ to about 10Λ.

13. A method for detecting electromagnetic radiation, comprising the steps of:
  exposing to electromagnetic radiation a body which undergoes a detectable change when exposed to electromagnetic radiation, and which includes means for detecting said change; and
  measuring said change, CHARACTERIZED IN THAT
  said body also includes a contoured surface which is substantially periodic and includes prominences, the average spacing, Λ, between, and the composition of, said prominences being chosen to couple at least a portion of said radiation into said body in the form of a propagating electromagnetic wave traveling through said body adjacent said contoured surface and/or localized plasma resonances within said prominences.

14. The method of claim 13 wherein the average spacing, Λ, between the prominences of said contoured surface is proportional to the wavelength of the electromagnetic radiation to be detected.

15. The method of claim 13 wherein the amplitude of said prominences ranges from about 0.1Λ to about 10Λ.

16. The method of claim 13 wherein said body includes a layer of electrically insulating material sandwiched between first and second layers of metal, and wherein said second layer of metal includes said contoured surface which is exposed to electromagnetic radiation during said exposing step.

17. The method of claim 16 wherein said electrically insulating layer has a dielectric breakdown strength greater than about $10^4$ volts/cm.

18. The method of claim 17 wherein said electrically insulating layer is a metallic oxide.

19. The method of claim 16 wherein the average spacing, Λ, between the prominences of said contoured surface is proportional to the wavelength of the electromagnetic radiation to be detected by said photodetector.

20. The method of claim 19 wherein the average amplitude of said prominences ranges from about 0.1Λ to about 0.3Λ.

21. The method of claim 16 wherein the metal of said second metal layer, and the average spacing, Λ, between the prominences of said contoured surface, are chosen to produce localized plasma resonances within said prominences.

22. The method of claim 21 wherein the amplitude of said prominences ranges from about 0.5Λ to about 10Λ.

* * * * *

UNITED STATES PATENT AND TRADEMARK OFFICE
CERTIFICATE OF CORRECTION

PATENT NO. : 4,556,790

DATED : December 3, 1985

INVENTOR(S) : Alastair M. Glass and Paul F. Liao

It is certified that error appears in the above-identified patent and that said Letters Patent is hereby corrected as shown below:

Column 11, line 31, "t" should read --to--; line 44, "II-IV" should read --II-VI--. Column 12, line 54, "and" should read --the--.

Signed and Sealed this

Sixteenth Day of September 1986

[SEAL]

Attest:

Attesting Officer

DONALD J. QUIGG

Commissioner of Patents and Trademarks